(12) United States Patent
Suzuki et al.

(10) Patent No.: US 6,622,293 B1
(45) Date of Patent: Sep. 16, 2003

(54) METHOD AND SYSTEM FOR DESIGNING WIRE LAYOUT WITHOUT CAUSING ANTENNA ERROR

(75) Inventors: Kenji Suzuki, Kawasaki (JP); Koji Banno, Kawasaki (JP); Toru Osajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 49 days.

(21) Appl. No.: 09/711,531

(22) Filed: Nov. 14, 2000

(30) Foreign Application Priority Data

Mar. 10, 2000  (JP) ........................................ 2000-067788

(51) Int. Cl.[7] .............................................. G06F 17/50
(52) U.S. Cl. ............................................ 716/12; 716/11
(58) Field of Search ....................................... 716/1–14

(56) References Cited

U.S. PATENT DOCUMENTS 5,903,031 A * 5/1999 Yamada et al. ............ 257/356
5,943,285 A * 8/1999 Kohno ....................... 365/230
5,966,517 A * 10/1999 Cronin, III et al. ............ 716/1
6,191,020 B1 * 2/2001 Liu et al. .................... 438/597
6,292,927 B1 * 9/2001 Gopisetty et al. ............. 716/11

* cited by examiner

*Primary Examiner*—Matthew Smith
*Assistant Examiner*—Sun James Lin
(74) *Attorney, Agent, or Firm*—Staas & Halsey LLP

(57) ABSTRACT

A method of determining wire layouts of a circuit in a semiconductor device that includes a plurality of modules each corresponding to a circuit block includes the steps of providing module terminals of modules to be connected together in a same single layer, determining layouts of wires connected to the module terminals inside the respective modules by laying out the wires in one or more layers no higher than the single layer, and determining layouts of inter-module wires connecting between the module terminals by laying out the inter-module wires in the one or more layers no higher than the single layer.

18 Claims, 14 Drawing Sheets

METHOD AND SYSTEM FOR DESIGNING WIRE LAYOUT WITHOUT CAUSING ANTENNA ERROR

BACKGROUND OF THE INVENTION

1. Field of the Invention

The present invention generally relates to methods and computer-aided-design devices for designing semiconductor integrated circuits, and particularly relates to a method and computer-aided-design devices for designing a wire layout of semiconductor integrated circuits.

2. Description of the Related Art

When manufacturing semiconductor devices, plasma exposure during a manufacturing process electrically charges up the wafer, and such electrical charge may result in damages to the gate-oxide layer of transistors. In order to avoid such damages caused by plasma exposure, an antenna check based on an antenna ratio needs to be performed at the time of semiconductor device design.

The antenna ratio is a ratio of a total combined area of all wires and vias to an area of a gate of current interest where these wires and vias are connected to the gate of current interest. The larger the ratio, i.e., the larger the total area of all the wires and vias relative to the gate, the greater the amount of charge built up per a unit area of the gate. This results in a greater risk of damage. At the time of design, therefore, a check needs to be made so as to restrict the antenna ratio to a value smaller than a certain limit.

When designing semiconductor devices, modules corresponding to functional blocks of a semiconductor-chip circuit are designed first, and, then, a wire layout is determined within each of the modules. Thereafter, wire layouts connecting the functional blocks together are decided between the modules.

The problem is that there may be a case in which a total area size of all wires connected to a cell input (gate) exceeds the maximum limit of a tolerable antenna ratio at the time of designing inter-module wire layouts even after wire layouts inside the modules are successfully designed without antenna errors. In such a case, it is necessary to go back to a design stage for designing layouts inside modules, resulting in an increase of processing time required for determining wire layouts. This problem will be described in detail in the following.

FIG. 1 is a plan view of a semiconductor device showing wire layouts inside as well as between modules. FIG. 2 is a cross-sectional view of the semiconductor device of FIG. 1.

In the semiconductor device of FIG. 1, a module 10 includes a cell-input portion 11 serving as an input node of a given cell (logic device) provided in the module 10, a module terminal 12, and wires L1 through L4 connecting between the cell-input portion 11 and the module terminal 12. A module 13 includes a cell-output portion 14 serving as an output node of a given cell (logic device) provided in the module 13, a module terminal 15, and wires L9 and L10 connecting between the cell-output portion 14 and the module terminal 15. As shown in FIG. 1, the module terminal 12 and the module terminal 15 are connected by inter-module wires L5 through L8.

As shown in FIG. 2, the wires L1 and L3 are formed in a first metal layer 21, and the wires L2, L4, L5, L7, and L10 are formed in a second metal layer 22. Further, the wire L6, L8, and L9 are implemented in a third metal layer 23. As can be seen by making a comparison with FIG. 1, the wires in the first metal layer 21 and the third metal layer 23 extend in a horizontal direction of FIG. 1, whereas the wires in the second metal layer 22 extend in a vertical direction of FIG. 1. Further, the cell-input portion 11 is provided in a polysilicon layer 24, and the cell-output portion 14 is formed in a diffusion layer 25.

For the sake of explanation, layers are taken into consideration one after another from the first metal layer 21 to the third metal layer 23 from the bottom to the top. When the first metal layer 21 is taken into consideration, the wire L1 is connected to the cell-input portion 11. When the second metal layer 22 is taken into consideration, the wires L2, L4, and L5 are connected to the cell-input portion 11. At a time when the second metal layer 22 is formed during the manufacturing process, therefore, the cell-input portion 11 builds up electrical charge therein that is commensurate with a total area size of the wires L1, L2, L3, L4, and L5.

Let us assume that an antenna ratio of the cell-input portion 11 is within a tolerable range as far as the wires L1, L2, L3, and L4 are concerned, but exceeds the maximum limit when the wire L5 is added. In this case, even if the circuit is designed not to suffer an antenna error when the wires L1, L2, L3, and L4 inside the module are laid out, addition of the inter-module wire L5 results in an exit from the tolerable range. This results in damages to the cell-input portion 11. In such a case, therefore, it is necessary to go back to a design stage for designing wire layouts inside modules, with a resulting increase in the processing time required for the wire layouts.

Accordingly, there is a need for a method and a computer-aided-design device for designing layouts efficiently while avoiding antenna error.

SUMMARY OF THE INVENTION

It is a general object of the present invention to provide a method and a computer-aided-design device that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method and a computer-aided-design device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method of determining wire layouts of a circuit in a semiconductor device that includes a plurality of modules each corresponding to a circuit block, the method including the steps of providing module terminals of modules to be connected together in a same single layer, determining layouts of wires connected to the module terminals inside the respective modules by laying out the wires in one or more layers no higher than the single layer, and determining layouts of inter-module wires connecting between the module terminals by laying out the inter-module wires in the one or more layers no higher than the single layer.

According to one aspect of the present invention, the method as described above further includes the steps of identifying a highest layer used in a first one of the modules if the first one of the modules has internal wire layouts thereof already determined in advance, and determining the layouts of wires connected to the module terminals inside a second one of the modules that is to be connected to the first one of the modules such that the wires reach a layer that is the same as said highest layer.

In the method as described above, terminals of modules are arranged in the same layer, and relevant wires inside the modules and inter-module wires are laid out in the layers no higher than the layer that includes the module terminals. When layers are formed successively from the bottom to the top in the manufacturing process, and the inter-module wires are connected to the module terminals in the end, a cell-input portion ends up being connected to a cell-output portion without an exception. This ensures that all electrical charge is discharged from the cell-output portion, thereby avoiding destruction of the cell as long as the wires inside the modules are laid out so as to avoid an antenna error. When a first module is to be connected to a second module that has internal wire layouts thereof already determined, wires inside the first module are laid out such as to reach the same layer as the highest layer of the second module, and inter-module wires are laid out by using layers no higher than the layer having the module terminals situated therein. When layers are formed successively from the bottom to the top in the manufacturing process, and the layer that is the highest layer of the second module is formed in the end, a cell-input portion ends up being connected to a cell-output portion without failure. This ensures that all electrical charge is discharged from the cell-output portion, thereby avoiding destruction of the cell as long as the wires inside the modules are laid out so as to avoid an antenna error. Accordingly, the method of designing wire layouts according to the present invention does not require redesigning of wire layouts inside modules after performing a design stage of laying out inter-module wires, thereby making it possible to design wire layouts efficiently while avoiding antenna errors.

According to another aspect of the present invention, a method of determining wire layouts of a circuit in a semiconductor device that includes a plurality of modules each corresponding to a circuit block includes the steps of determining a highest wire layer to be used in the semiconductor device; and providing a module terminal of a module in said highest wire layer if the module terminal is connected to an input of a logic device inside the module, and is to be connected to another module.

In the method described above, a module terminal to be connected to a cell-input portion is provided in the highest layer of the semiconductor chip. and wires inside the modules are laid out such as to avoid antenna error while inter-module wires are laid out without particular layout restrictions. When layers are formed successively from the bottom to the top in the manufacturing process, no antenna error occurs prior to the formation of the highest layer since the wires inside the modules are not connected to the inter-module wires. Upon the formation of the highest layer, the cell-input portion is inevitably connected to a cell-output portion, so that all electrical charge is discharged from the cell-output portion. Accordingly, the method of designing wire layouts according to the present invention does not require redesigning of wire layouts inside modules after performing a design stage of laying out inter-module wires, thereby making it possible to design wire layouts efficiently while avoiding antenna errors.

DESCRIPTION OF THE PREFERRED EMBODIMENTS

In the following, embodiments of the present invention will be described with reference to the accompanying drawings.

Figure 1:
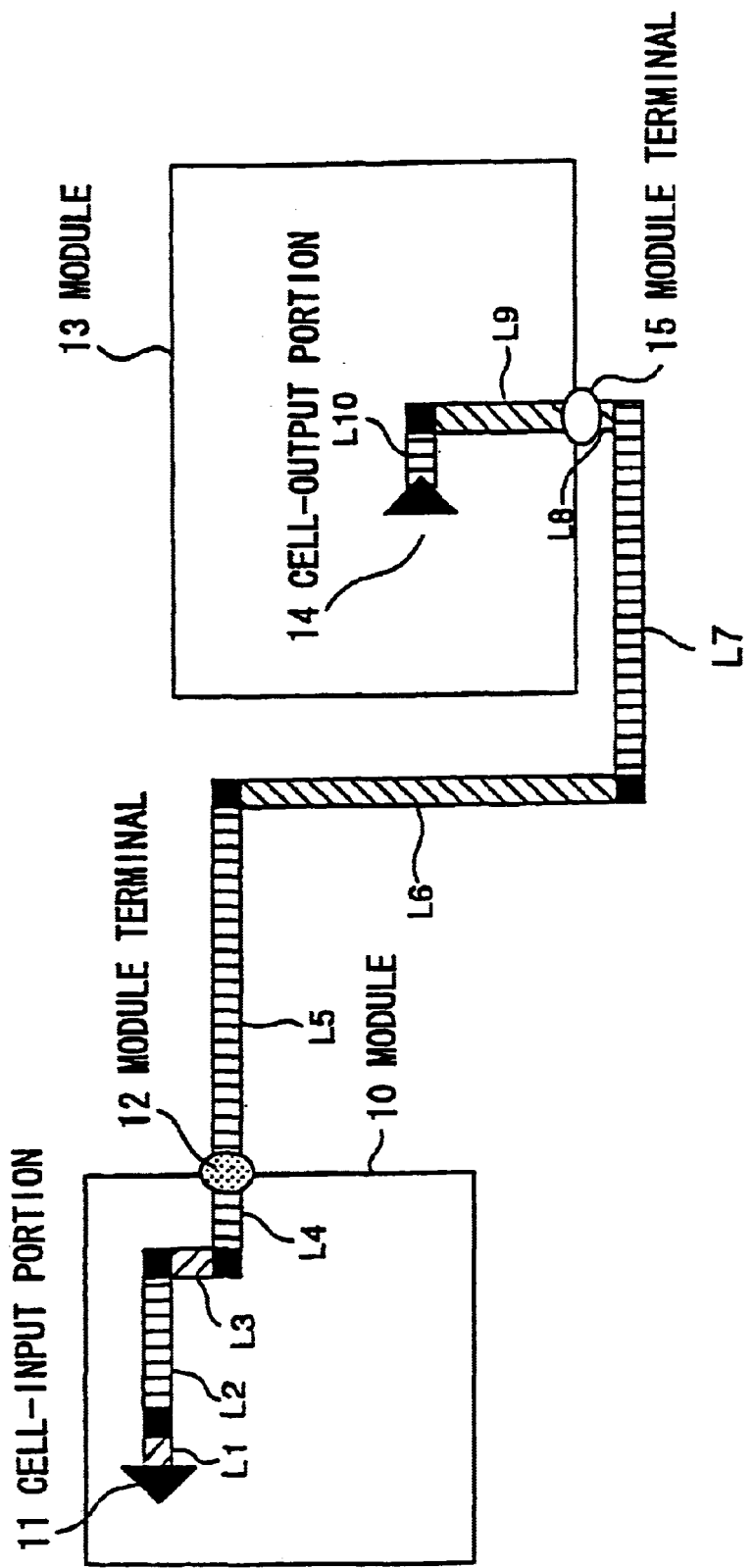
FIG. 1 is a plan view of a semiconductor device showing wire layouts inside as well as between modules.
Figure 2:
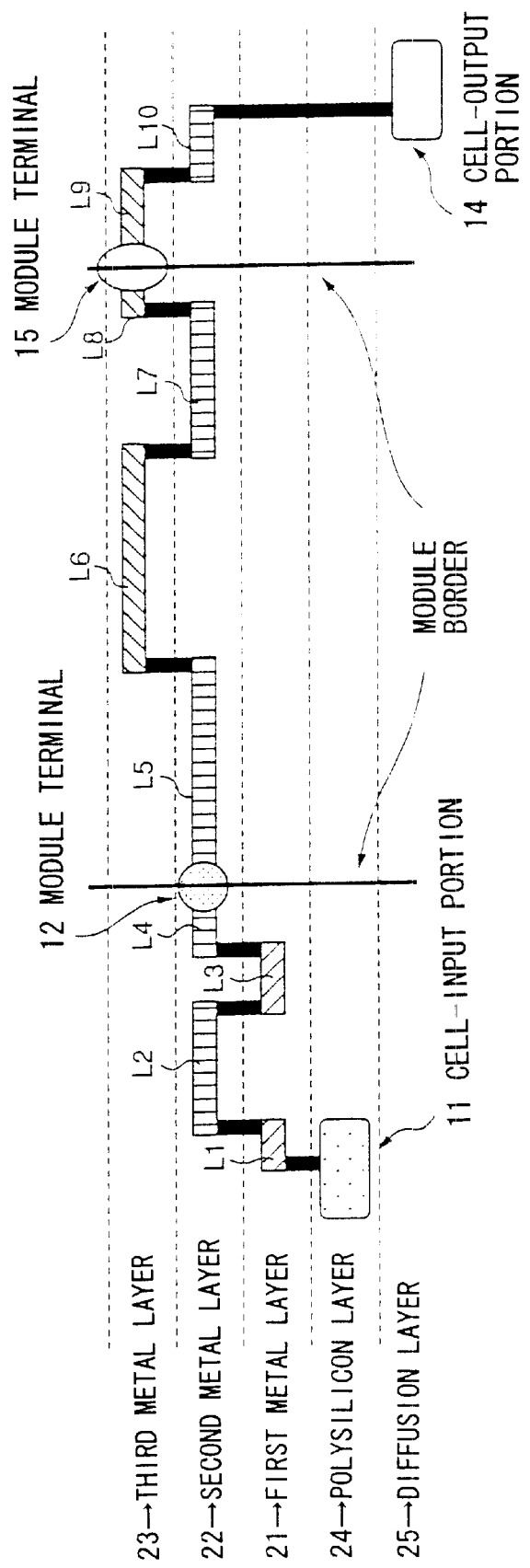
FIG. 2 is a cross-sectional view of the semiconductor device of FIG. 1.
Figure 3:
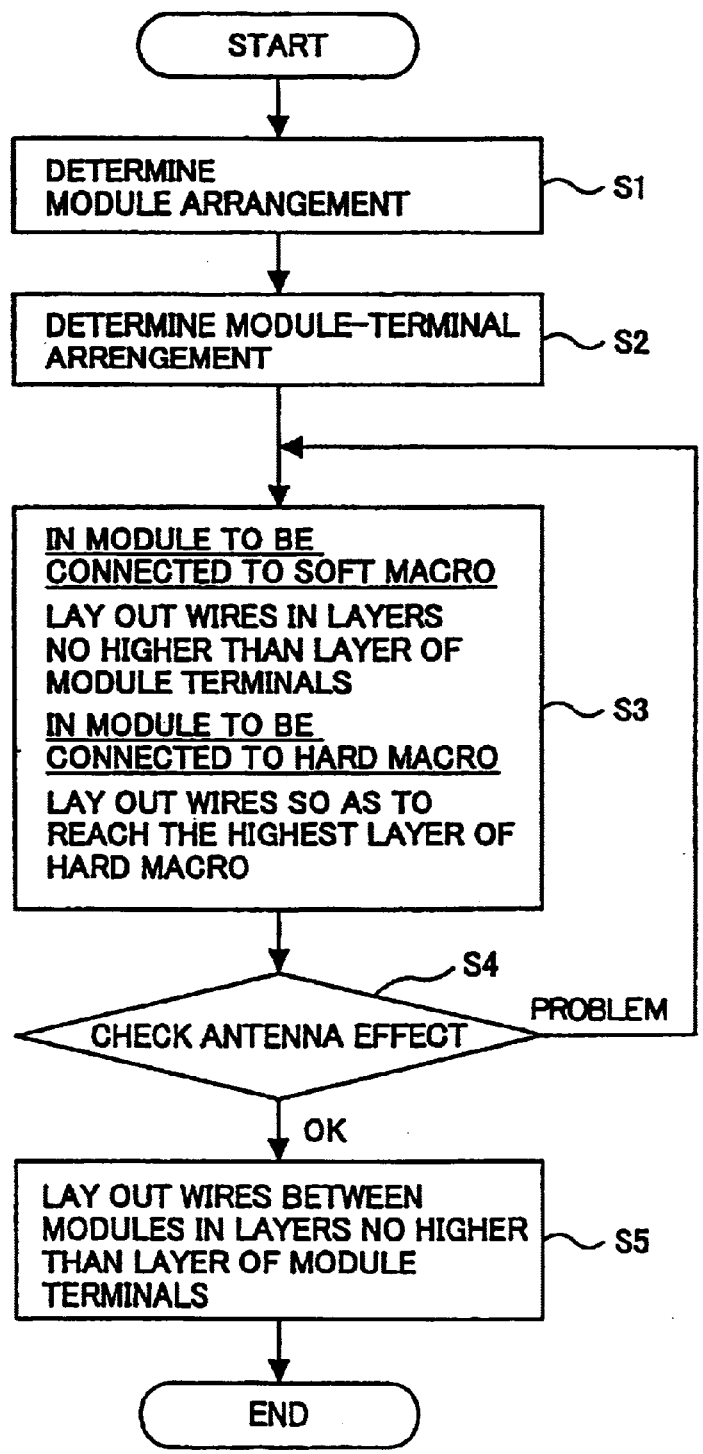
FIG. 3 is a flowchart of a method of designing wire layouts according to a first embodiment of the present invention.

FIG. 3 is a flowchart of a method of designing wire layouts according to a first embodiment of the present invention. FIGS. 4A through 4D are illustrative drawings for explaining the method of designing wire layouts.

Figure 4A:
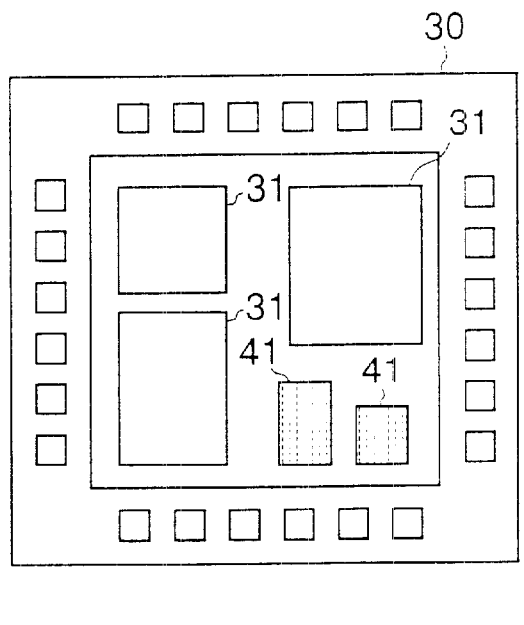
FIGS. 4A through 4D are illustrative drawings for explaining the method of designing wire layouts.

At a step S1 of FIG. 3, position of each module is determined. Namely, as shown in FIG. 4A, modules 31 and 41 serving as functional blocks are positioned within a semiconductor chip 30. This is done by use of a floor planner. Here, the modules 31 are soft macros, and the modules 41 are hard macros. The soft macro refers to a module that has a physical layout thereof not yet determined, and that has a corresponding net list defining an internal logic structure. The hard macro refers to a module that has a determined physical layout, and that has physical data as well as logic data.

Figure 4B:
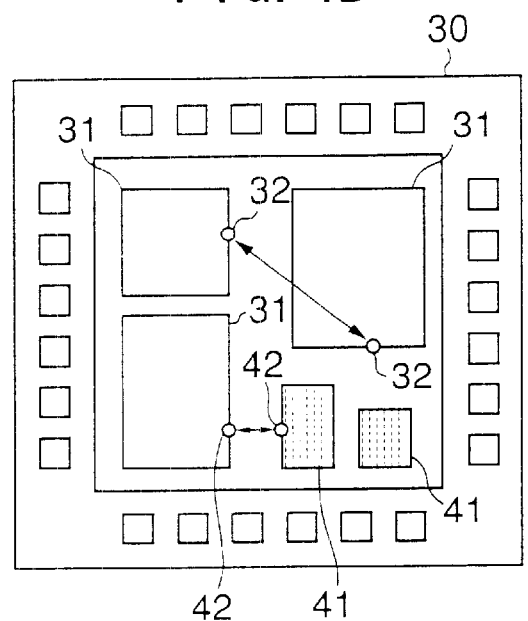

At a step S2, positions of module terminals are determined. Namely, as shown in FIG. 4B, module terminals 32 and 42 are identified in order to connect the modules together, and are positioned respectively. The fact that the module terminals 32 and 42 are necessary for the purpose of connecting the modules together is learned based on information about inter-module connections when such information is obtained from the net lists. After the module terminals 32 are identified to connect the soft-macro modules 31 together, these module terminals 32 are arranged in the same layer. If there is a module that is to be connected to one of the hard-macro modules 41, a layer having the hard-macro terminal 42 therein is identified based on library information about the hard-macro modules 41, and a terminal 42 of the module to be connected is arranged in the same layer.

Figure 4C:
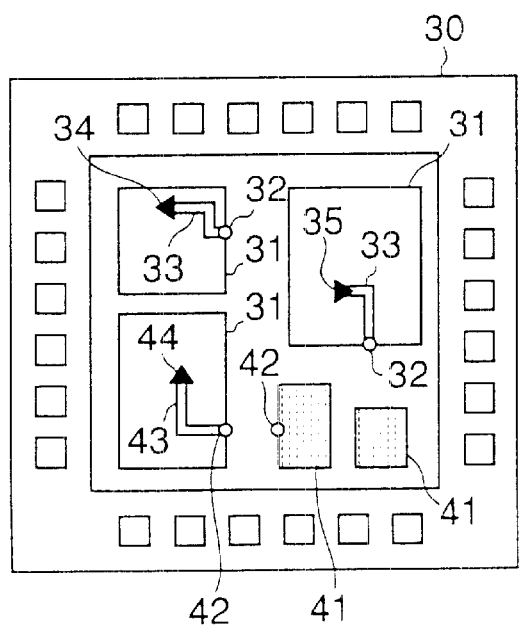

At a step S3, as far as a module to be connected to a soft macro is concerned, a wire layout inside this module is determined by using layers no higher than the layer of the module terminal, and, as far as a module to be connected to a hard macro is concerned, a wire layout inside this module is determined while making sure that the wire layout reaches the highest layer used in the hard macro. Namely, as shown in FIG. 4C, wires 33 are laid out to connect the module terminals 32 to either a cell-input portion 34 serving as an input to a logic device or a cell-output portion 35 serving as an output of a logic device inside the respective soft-macro modules 31, such that the wires are laid out in layers no higher than the layer having the module terminals 32 provided therein. Further, inside the module 31 that is to be connected to one of the hard-macro modules 41, wires 43 are provided to connect the module terminal 42 to a cell-input portion 44 serving as an input to a logic device, such that the wires 43 are laid out to reach the same layer as the highest layer of the hard macro 41. Wires other than the wires for connecting the inputs/outputs of logic devices to module terminals are not under the restrictions as described above, and can be laid out freely by using any layers.

At a step S4, a check is made on an antenna ratio inside each module. Namely, a check is made as to whether wires connected to an input of each logic device inside each module are laid out so as to make an antenna ratio smaller than the maximum tolerable limit. If a check result indicates a problem, the procedure goes back to the step S3, at which the wire layouts inside the module are corrected. If the check result indicates absence of problems, the procedure goes to a step S5.

Figure 4D:
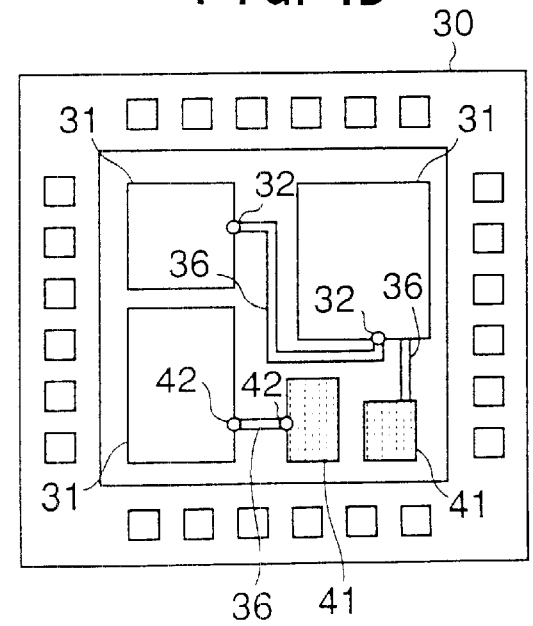

At the step S5, inter-module wire layouts (i.e., wire layouts between modules) are determined by using layers no higher than the layers having the module terminals provided therein. Namely, as shown in FIG. 4D, inter-module wires 36 are laid out to connect the modules 31 and 41 together, such that layers used for laying out the inter-module wires 36 are no higher than the layers that includes the module terminals 32 and 42.

The procedure then comes to an end.

Figure 5:
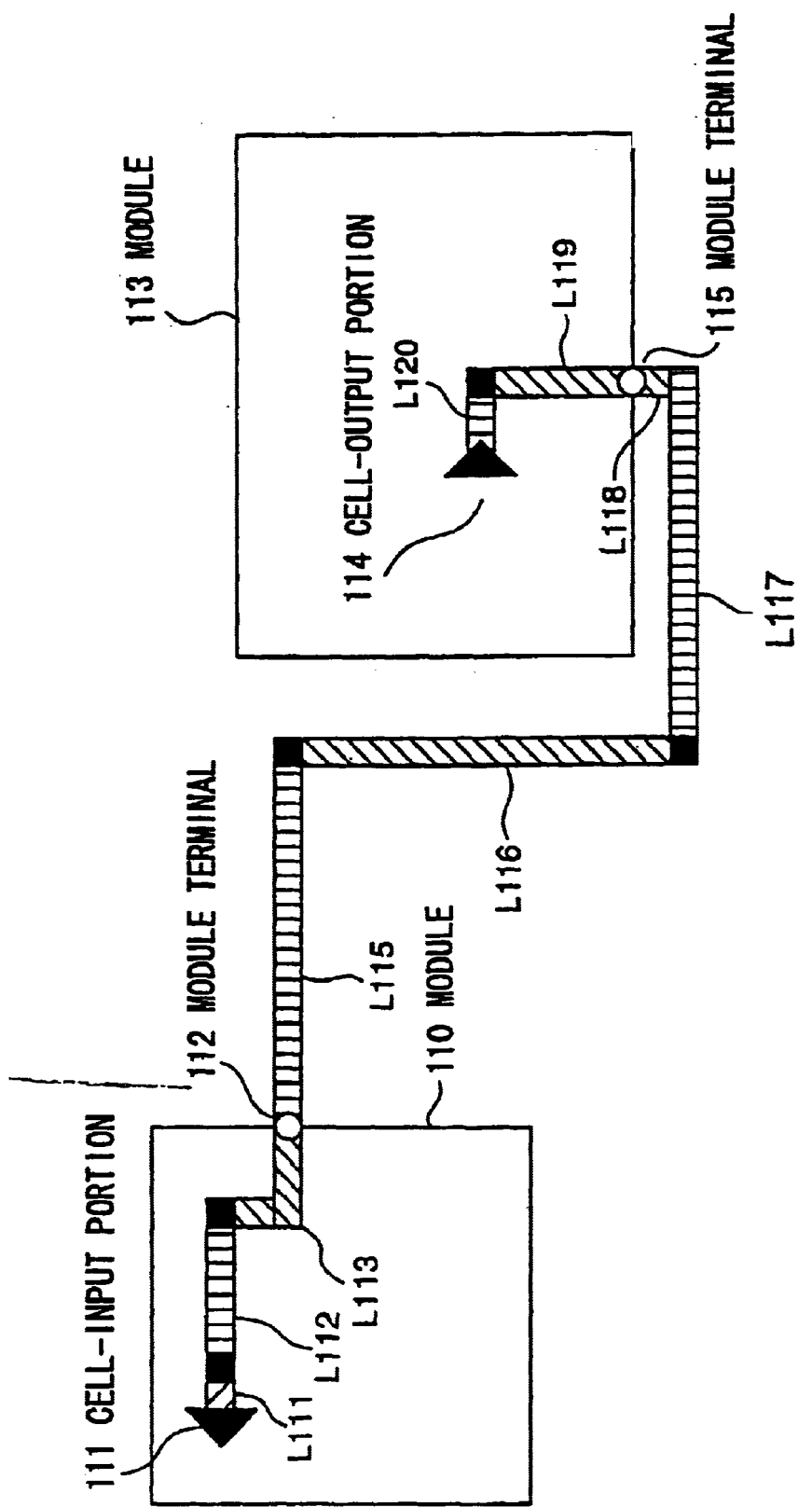
FIG. 5 is a plan view of a semiconductor device showing an example of intra-module wires and inter-module wires determined by the method of designing wire layouts according to the present invention.
Figure 6:
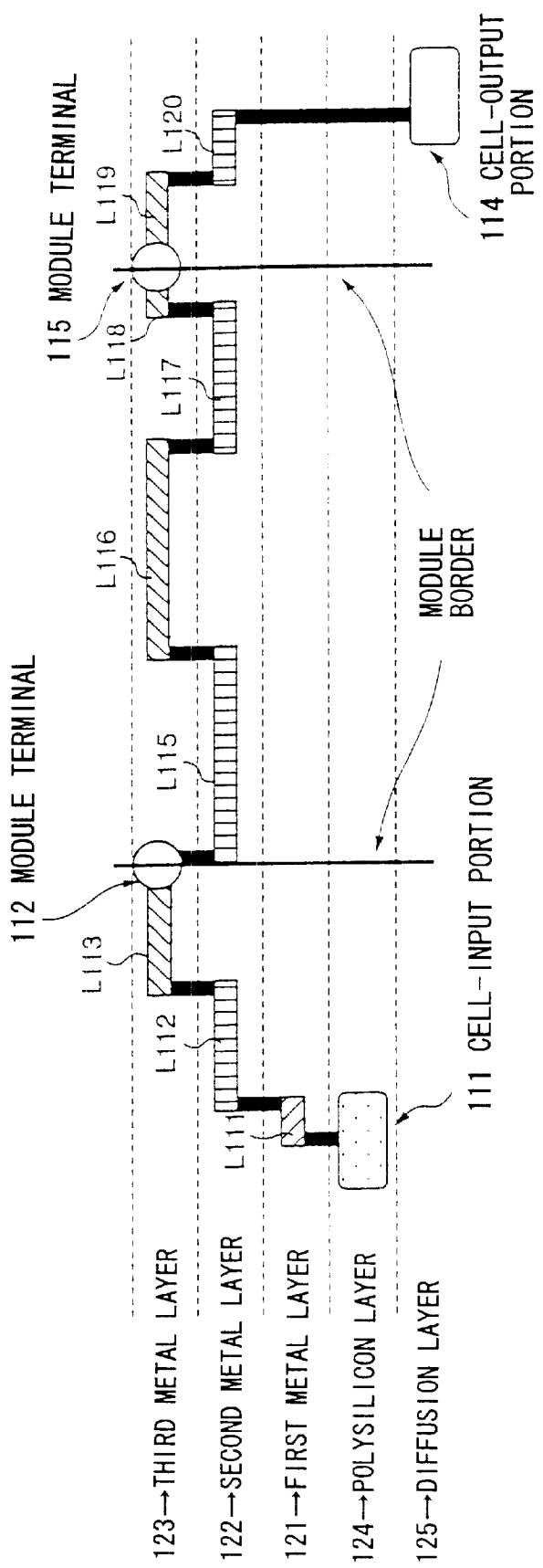
FIG. 6 is a cross-sectional view of the semiconductor device of FIG. 5.

FIG. 5 is a plan view of a semiconductor device showing an example of intra-module wires and inter-module wires determined by the method of designing wire layouts according to the present invention. FIG. 6 is a cross-sectional view of the semiconductor device of FIG. 5.

In the semiconductor device of FIG. 5, a soft-macro module 110 includes a cell-input portion 111 serving as an input node of a given cell (logic device) provided in the module 110, a module terminal 112, and wires L111 through L113 connecting between the cell-input portion 111 and the module terminal 112. A soft-macro module 113 includes a cell-output portion 114 serving as an output node of a given cell (logic device) provided in the module 113, a module terminal 115, and wires L119 and L120 connecting between the cell-output portion 114 and the module terminal 115. As shown in FIG. 5, the module terminal 112 and the module terminal 115 are connected by inter-module wires L115 through L118.

As shown in FIG. 6, the wire L111 is formed in a first metal layer 121, and the wires L112, L115, L117, and L120 are formed in a second metal layer 122. Further, the wires L113, L116, L118, and L119 are implemented in a third metal layer 123. Further, the cell-input portion 111 is provided in a polysilicon layer 124, and the cell-output portion 114 is formed in a diffusion layer 125.

In FIG. 6, layers are taken into consideration one after another from the first metal layer 121 to the third metal layer 123 from the bottom to the top. When the first metal layer 121 is taken into consideration, the wire L111 is connected to the cell-input portion 111.

When the second metal layer 122 is taken into consideration, the wire L112 is connected to the cell-input portion 111. At a time when the second metal layer 122 is formed during the manufacturing process, therefore, the cell-input portion 111 builds up electrical charge therein that is commensurate with a total area size of the wires L111 and L112.

When the third metal layer 123 is taken into consideration, the wires L113, L116, L118, and L119 are connected to the cell-input portion 111. At a time when the third metal layer 123 is formed during the manufacturing process, therefore, the cell-input portion 111 is connected to electrical charge that is commensurate with a total area size of the wires L111, L112, L113, L116, L118, and L119. In this case, however, the wire L119 is also connected to the cell-output portion 114 via the wire L120. Accordingly, the electrical charge described above is discharged altogether through the cell-output portion 114, thereby inflicting no damage to the cell-input portion 111.

In the method of designing wire layouts according to the first embodiment of the present invention as described above, terminals of soft-macro modules are arranged in the same layer, and relevant wires inside the modules and inter-module wires are laid out in the layers no higher than the layer that includes the module terminals. When layers are formed successively from the bottom to the top in the manufacturing process, and the inter-module wires are connected to the module terminals in the end, the cell-input portion ends up being connected to the cell-output portion without an exception. This ensures that all electrical charge is discharged from the cell-output portion, thereby avoiding destruction of the cell as long as the wires inside the modules are laid out so as to avoid an antenna error. The method of designing wire layouts according to the present invention does not require redesigning of wire layouts inside modules after performing a design stage of laying out inter-module wires, thereby making it possible to design wire layouts efficiently while avoiding antenna errors.

Figure 7:
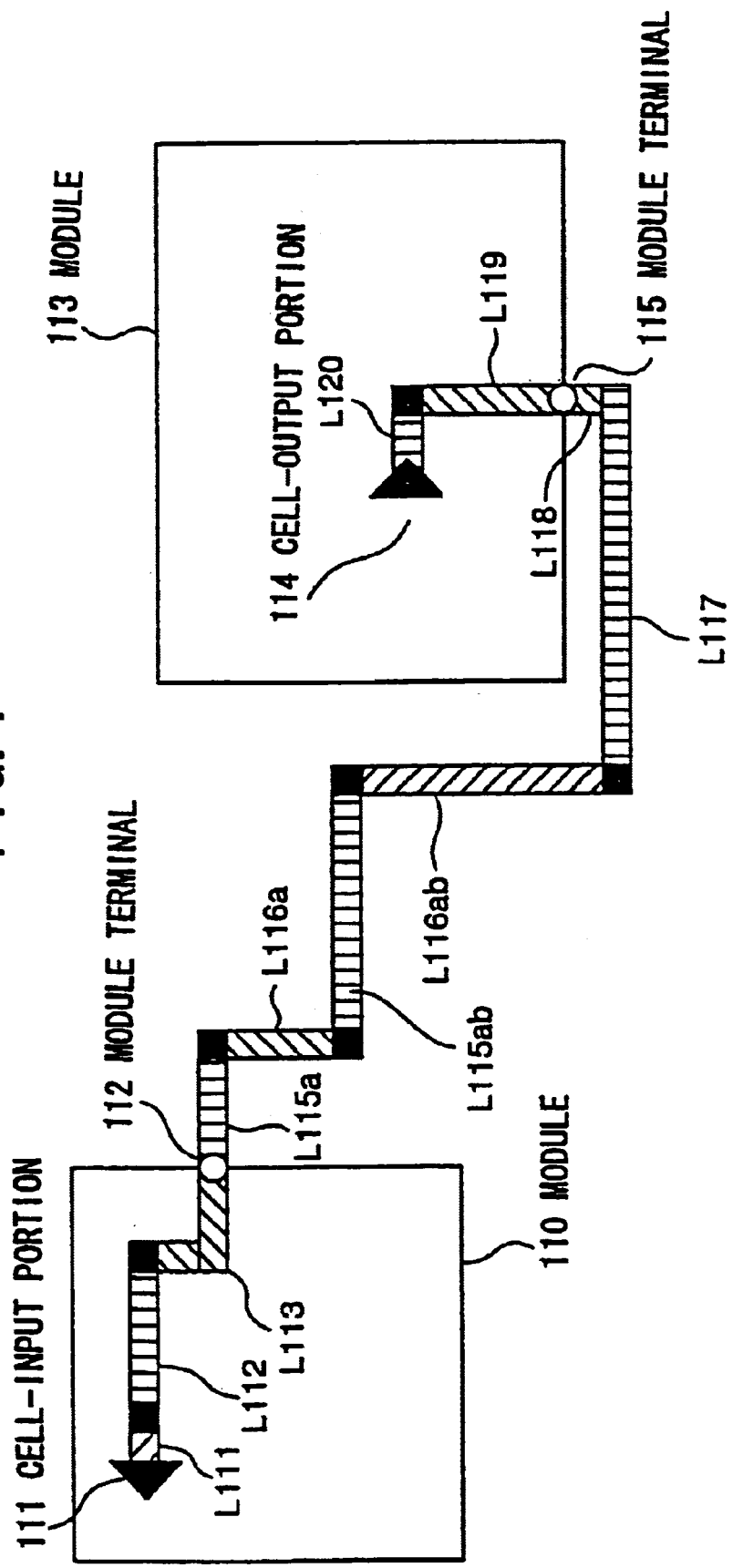
FIG. 7 is a plan view of a semiconductor device showing another example of intra-module wires and inter-module wires determined by the method of designing wire layouts according to the present invention.
Figure 8:
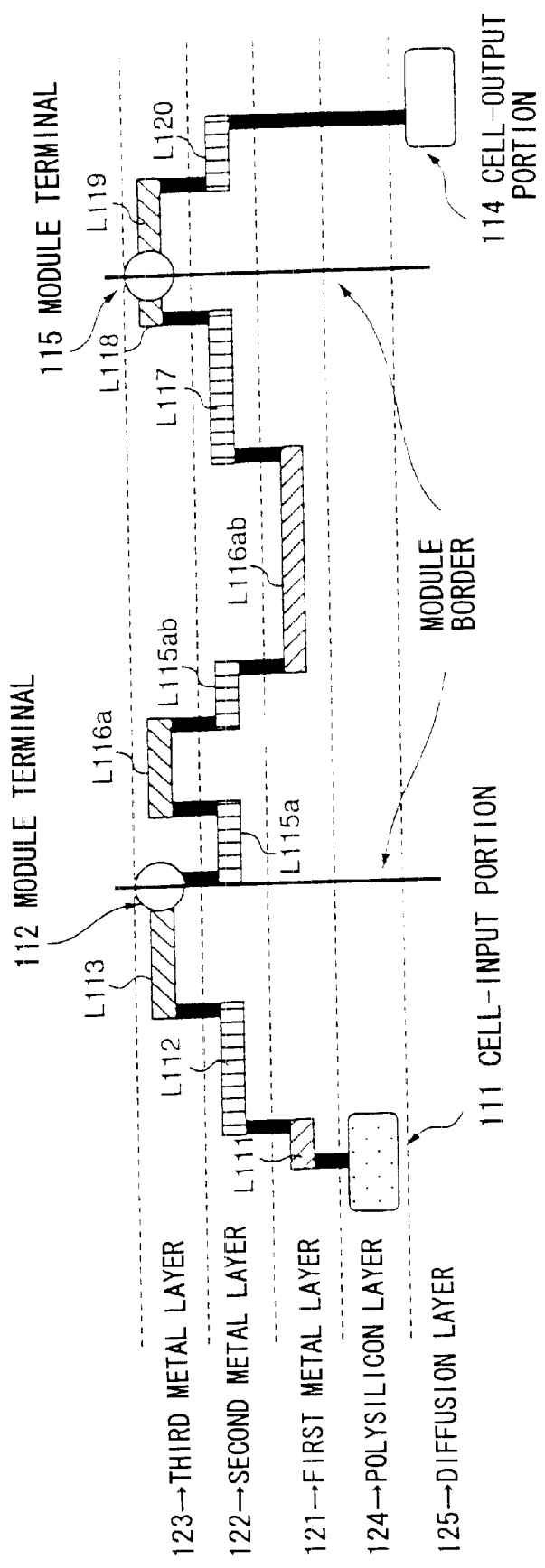
FIG. 8 is a cross-sectional view of the semiconductor device of FIG. 7.

FIG. 7 is a plan view of a semiconductor device showing another example of intra-module wires and inter-module wires determined by the method of designing wire layouts according to the present invention. FIG. 8 is a cross-sectional view of the semiconductor device of FIG. 7. In FIG. 7 and FIG. 8, the same elements as those of FIG. 5 and FIG. 6 are referred to by the same numerals.

In the semiconductor device shown in FIG. 7 and FIG. 8, the soft-macro modules 110 and 113 are the same as those of FIG. 5 and FIG. 6. As shown in FIG. 8, however, wires connecting between the module terminal 112 and the module terminal 115 are different from the previous example, and include inter-module wires L115a, L116a, L115ab, L116ab, L117, and L118.

As shown in FIG. 8, the wires L111 and L116ab are formed in the first metal layer 121, and the wires L112, L115a, L115ab, L117, and L120 are formed in the second metal layer 122. Further, the wires L113, L116a, L118, and L119 are implemented in the third metal layer 123.

In FIG. 8, when the third metal layer 123 is formed by forming layers one after another from the bottom to the top by starting from the first metal layer 121, the cell-input portion 111 is connected to wires having electrical charge that is commensurate with a total area size of the wires L111, L112, L113, L116a, L118, and L119. In this case, however, the wire L119 is also connected to the cell-output portion 114 via the wire L120. Accordingly, the electrical charge described above is discharged altogether through the cell-output portion 114, thereby inflicting no damage to the cell-input portion 111.

Figure 9:
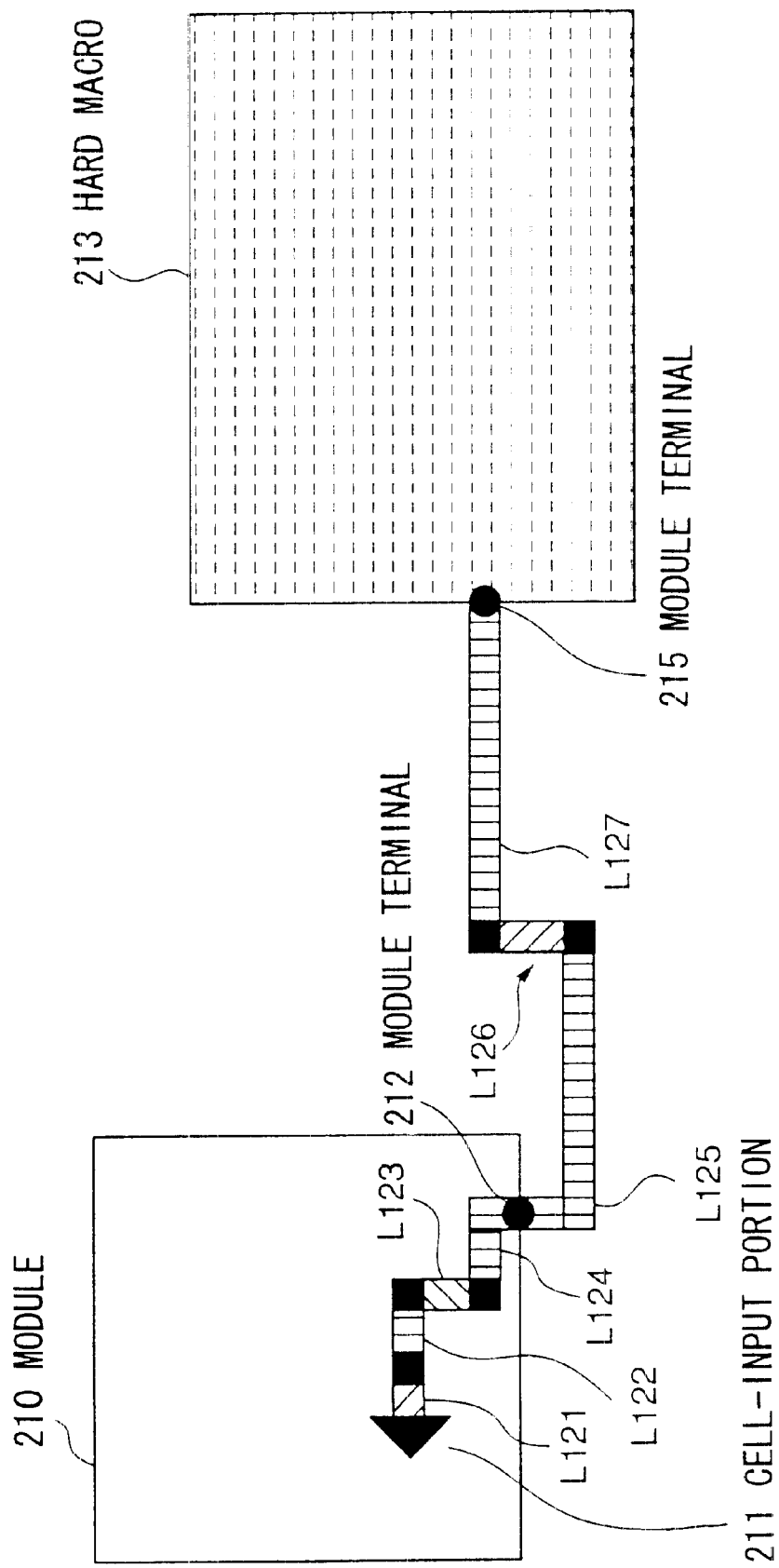
FIG. 9 is a plan view of a semiconductor device showing another example of intra-module wires and inter-module wires determined by the method of designing wire layouts according to the present invention when one of the connected modules is a hard-macro module.
Figure 10:
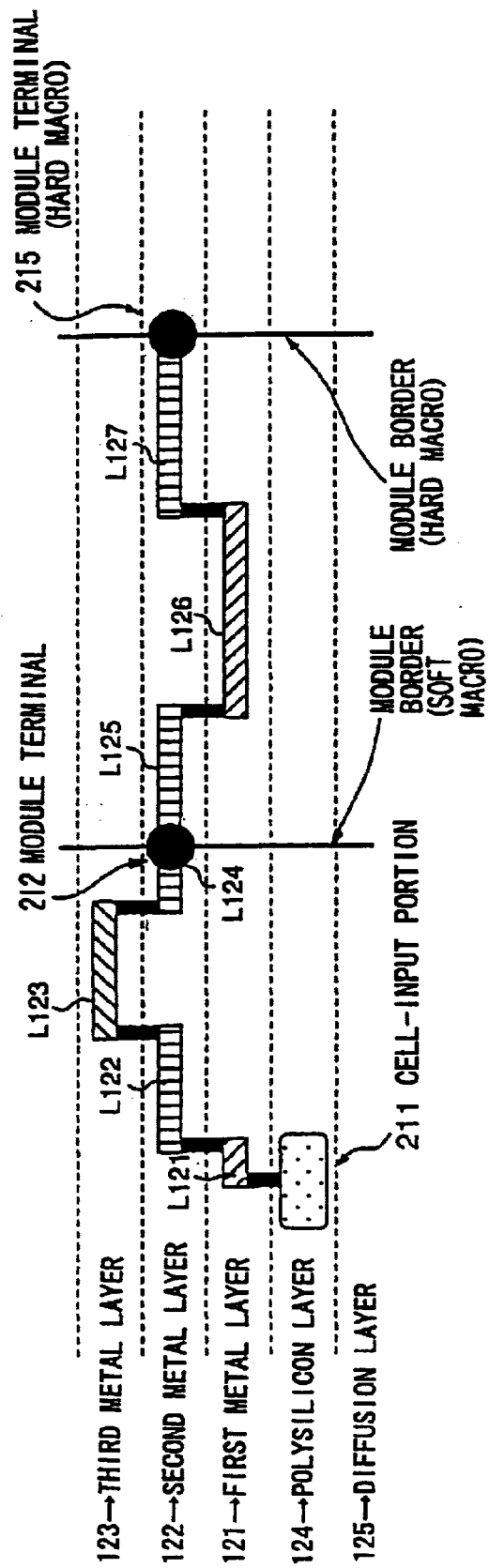
FIG. 10 is a cross-sectional view of the semiconductor device of FIG. 9.

FIG. 9 is a plan view of a semiconductor device showing another example of intra-module wires and inter-module wires determined by the method of designing wire layouts according to the present invention when one of the connected modules is a hard-macro module. FIG. 10 is a cross-sectional view of the semiconductor device of FIG. 9.

In the semiconductor device of FIG. 9, a soft-macro module 210 includes a cell-input portion 211 serving as an input node of a given cell (logic device) provided in the module 210, a module terminal 212, and wires L121 through L124 connecting between the cell-input portion 211 and the module terminal 212. A hard-macro module 213 includes a module terminal 215. As shown in FIG. 9, the module terminal 212 and the module terminal 215 are connected by inter-module wires L125 through L127.

In FIG. 10, the hard-macro module 213 uses layers up to the third metal layer 123. Namely, the highest layer of the hard-macro module 213 is the third metal layer 123. As shown in FIG. 10, the wires L121 and L126 are formed in the first metal layer 121, and the wires L122, L124, L125, and L127 are formed in the second metal layer 122. Further, the wire L123 is implemented in the third metal layer 123. Further, the cell-input portion 211 is provided in the poly-silicon layer 124.

In FIG. 10, when the second metal layer 122 is formed by forming layers one after another from the bottom to the top by starting from the first metal layer 121, the cell-input portion 211 build up electrical charge therein that is commensurate with a total area size of the wires L121 and L122. In the method of designing wire layouts according to the present invention, it is basic requirements that wires inside modules are laid out so as not to cause antenna errors. At the time when the second metal layer 122 is formed, therefore, there is no problem regarding the antenna effect.

When the third metal layer 123 is formed, the cell-input portion 211 is connected to wires having electrical charge that is commensurate with a total area size of the wires L121, L122, ad L123. In this case, however, the highest layer of the hard-macro module 213 is the third metal layer 123. It is thus certain that a cell-output portion inside the hard-macro module 213 is connected to the cell-input portion 211 when the third layer 123 is formed. That is, the electrical charge is discharged altogether from the cell-output portion, thereby avoiding damages to the cell-input portion 211.

Namely, in the module that is to be connected to the hard-macro module, wires connecting the cell-input portion to the module terminal are laid out such as to reach the same layer as the highest layer of the hard-macro module 213. When wire layouts inside this module are completed, electrical charge never fails to escape from the cell-output portion of the hard macro.

In the method of designing wire layouts according to the first embodiment of the present invention as described above, when a soft-macro module is to be connected to a hard-macro module, a terminal of the soft-macro module is provided in the same layer as the layer that includes a corresponding terminal of the hard macro, and wires inside the soft-macro module are laid out such as to reach the same layer as the highest layer of the hard-macro module. Further, inter-module wires are laid out by using layers no higher than the layer having the module terminals situated therein. When layers are formed successively from the bottom to the top in the manufacturing process, and the layer that is the highest layer of the hard macro is formed in the end, the cell-input portion ends up being connected to a cell-output portion without failure. This ensures that all electrical charge is discharged from the cell-output portion, thereby avoiding destruction of the cell as long as the wires inside the modules are laid out so as to avoid an antenna error. The method of designing wire layouts according to the present invention does not require redesigning of wire layouts inside modules after performing a design stage of laying out inter-module wires, thereby making it possible to design wire layouts efficiently while avoiding antenna errors.

Figure 11:
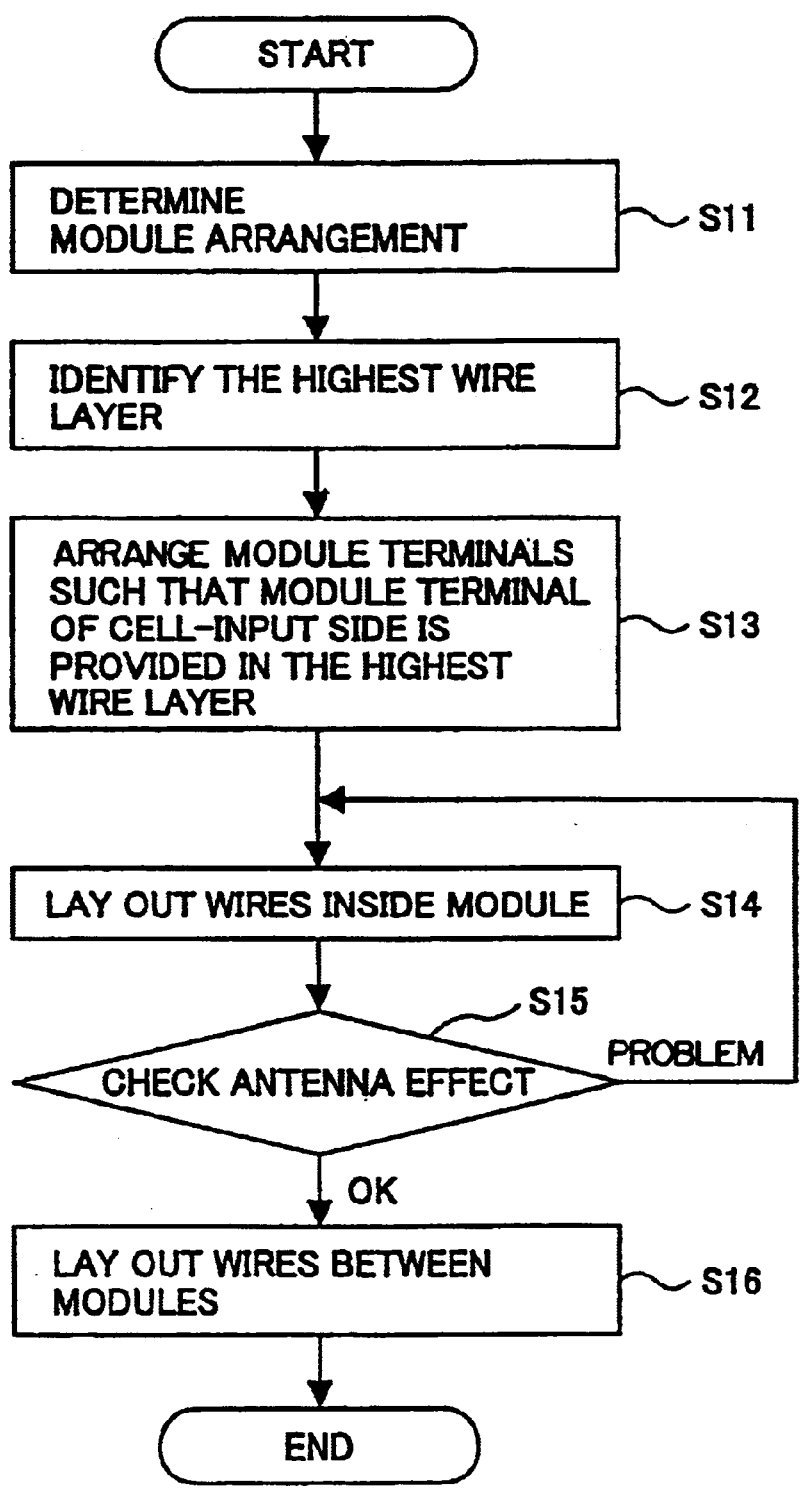
FIG. 11 is a flowchart of a method of designing wire layouts according to a second embodiment of the present invention.

FIG. 11 is a flowchart of a method of designing wire layouts according to a second embodiment of the present invention.

At a step S11 of FIG. 11, position of each module is determined.

At a step S12, the highest wire layer is determined. Namely, the number of wire layers to be used in a semiconductor device (semiconductor chip) is determined in the floor plan determined at the step S11 so as to identify the highest wire layer.

At a step S13, positions of module terminals are determined such that the module terminals at the cell-input side are provided in the highest wire layer. The fact that module terminals are necessary for the purpose of connecting the modules together is learned based on information about inter-module connections when such information is obtained from net lists. After the module terminals are identified to connect the modules together, module terminals to be connected to cellinput sides are identified, and are arranged in the highest wire layer obtained at the step S12. Other module terminals are positioned without any restrictions as to which layers are to be used.

At a step S14, wire layouts inside the modules are determined. No particular restrictions are imposed, and any layers can be used for laying out the wires.

At a step S15, a check on the antenna ratio is made. Namely, a check is made as to whether wires are laid out to make an antenna ratio smaller than the maximum limit as far as wires connected to cell-input portions inside the modules are concerned. If the check results indicate a problem, the procedure goes back to the step S14. If the check results indicate absence of problems, the procedure goes to a step S16.

At the step S16, inter-module wire layouts are determined. No particular restrictions are imposed, and any layers can be used for laying out the wires.

The procedure comes to an end.

Figure 12:
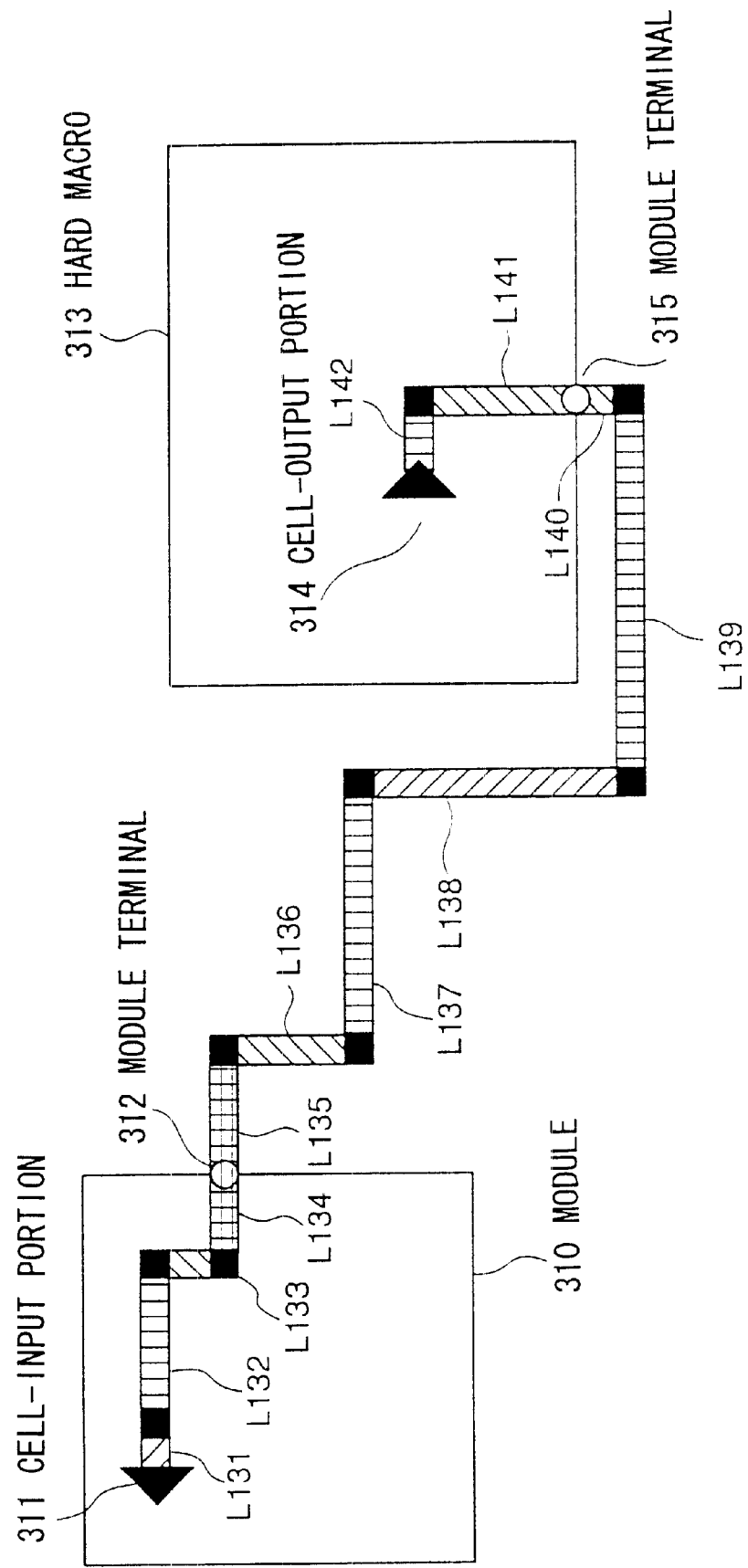
FIG. 12 is a plan view of a semiconductor device showing an example of intra-module wires and inter-module wires determined by the method of designing wire layouts according to the second embodiment of the present invention.
Figure 13:
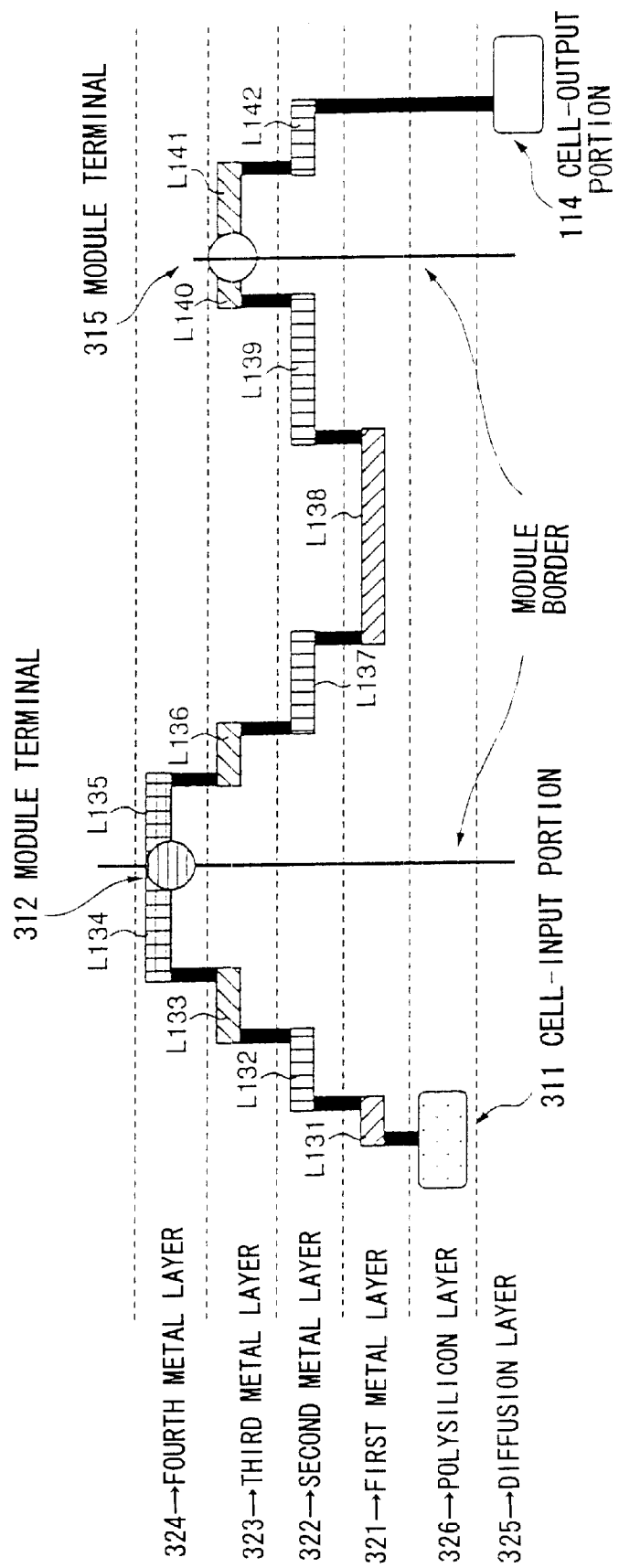
FIG. 13 is a cross-sectional view of the semiconductor device of FIG. 12.

FIG. 12 is a plan view of a semiconductor device showing an example of intra-module wires and inter-module wires determined by the method of designing wire layouts according to the second embodiment of the present invention. FIG. 13 is a cross-sectional view of the semiconductor device of FIG. 12.

In the semiconductor device of FIG. 12, a soft-macro module 310 includes a cell-input portion 311 serving as an input node of a given cell (logic device) provided in the module 310, a module terminal 312, and wires L131 through L134 connecting between the cell-input portion 311 and the module terminal 312. A hard-macro module 313 includes a cell-output portion 314 serving as an output node of a given cell (logic device) provided in the module 313, a module terminal 315, and wires L141 and L142 connecting between the cell-output portion 314 and the module terminal 315. As shown in FIG. 12, the module terminal 312 and the module terminal 315 are connected by inter-module wires L135 through L140.

In FIG. 13, a fourth metal layer 324 is the highest layer of the illustrated semiconductor device. As shown in FIG. 13, the wires L131 and L138 are formed in a first metal layer 321, and the wires L132, L137, L139, and L142 are formed in a second metal layer 322. Further, the wires L133, L136, L140, and L141 are implemented in a third metal layer 323. The wires L134 and L135 are provided in the fourth metal layer 324. The cell-input portion 311 is provided in a polysilicon layer 326, and the cell-output portion 314 is formed in a diffusion layer 325.

In FIG. 13, when the third metal layer 323 is formed by forming layers one after another from the bottom to the top by starting from the first metal layer 321, the cell-input portion 311 build up electrical charge therein that is commensurate with the total area size of the wires L131 through L133. In the method of designing wire layouts according to the present invention, it is basic requirements that wires inside modules are laid out so as not to cause antenna errors. At the time when the third metal layer 323 is formed, therefore, there is no problem regarding the antenna ratio.

When the fourth metal layer 324 is formed, the cell-input portion 311 is connected to wires having electrical charge that is commensurate with the total area size of the wires L131, L132, L133, L134, and L135. In this case, however, the highest layer of the semiconductor chip is the fourth metal layer 324. It is thus certain that the cell-output portion 314 corresponding to the cell-input portion 311 is connected to the cell-input portion 311 when the fourth metal layer 324 is formed. That is, the electrical charge is discharged altogether from the cell-output portion 314, thereby avoiding damages to the cell-input portion 311.

In the method of designing wire layouts according to the second embodiment of the present invention as described above, a module terminal to be connected to a cell-input portion is provided in the highest layer of the semiconductor chip, and wires inside the modules are laid out such as to avoid antenna error while inter-module wires are laid out without particular layout restrictions. When layers are formed successively from the bottom to the top in the manufacturing process, no antenna error occurs prior to the formation of the highest layer since the wires inside the modules are not connected to the inter-module wires. Upon the formation of the highest layer, the cell-input portion is inevitably connected to the cell-output portion, so that all electrical charge is discharged from the cell-output portion. The method of designing wire layouts according to the present invention does not require redesigning of wire layouts inside modules after performing a design stage of laying out inter-module wires, thereby making it possible to design wire layouts efficiently while avoiding antenna errors.

Figure 14:
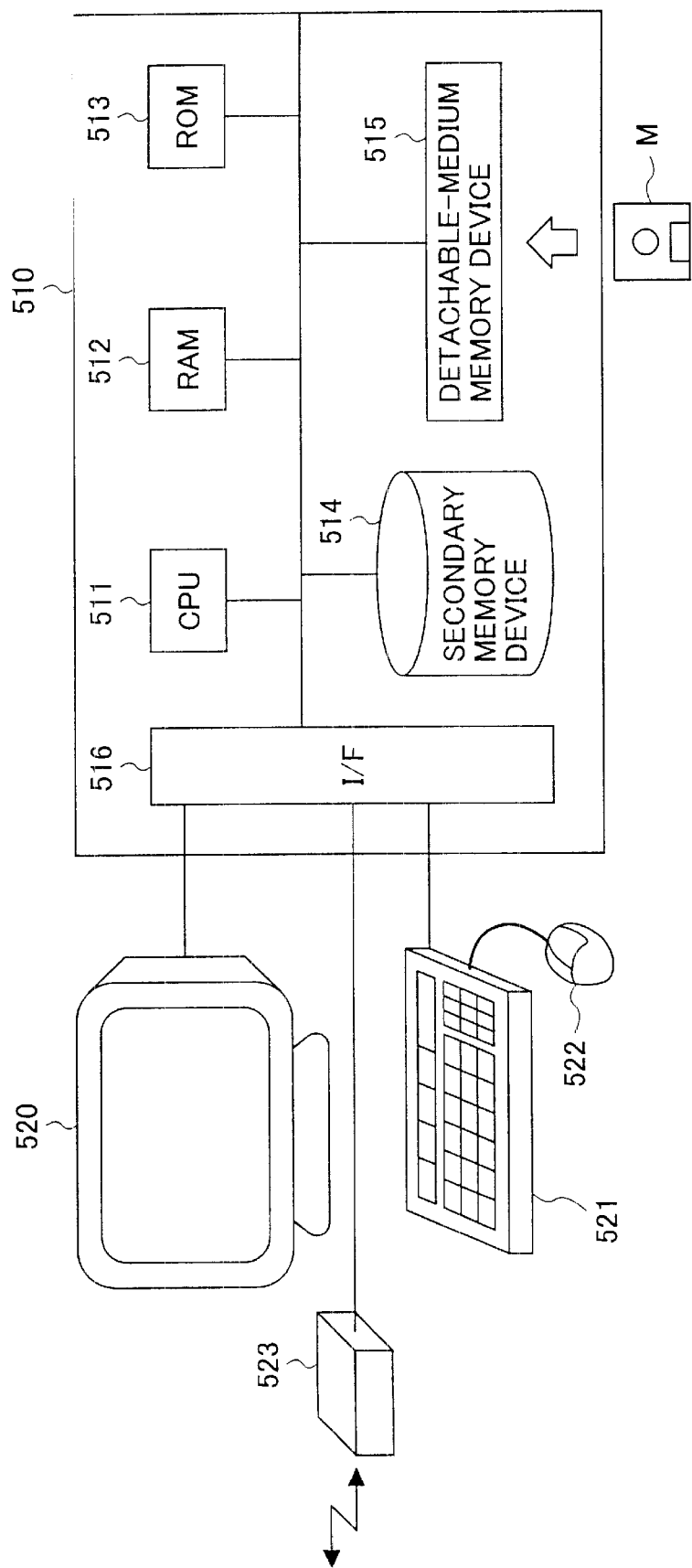
FIG. 14 is an illustrative drawing showing a configuration of a system which practices the method of designing wire layouts according to the present invention.

FIG. 14 is an illustrative drawing showing a configuration of a system which practices the method of designing wire layouts according to the present invention.

As shown in FIG. 14, the system for practicing the method of designing wire layouts according to the present invention is implemented by a computer such as an engineering workstation.

The computer-aided-design system of FIG. 14 includes a computer 510, a display device 520 connected to the computer 510, a communication device 523, and an input device. The input device includes a keyboard 521 and a mouse 522, for example. The computer 510 includes a CPU 511, a RAM 512, a ROM 513, a secondary memory device 514 such as a hard drive, a detachable-medium memory device 515, and an interface 516.

The keyboard 521 and the mouse 522 provide user interface, and receive various commands for operating the computer 510, user responses to the prompt presented by the computer 510, etc. The display device 520 presents processing results obtained by the computer 510, and, also, presents various data for interacting with the user for operation of the computer 510. The communication device 523 is used for the purpose of communicating with remote cites, and includes a modem, a network interface, etc.

The method of designing wire layouts according to the present invention is provided as a computer program executable by computer 510. The computer program is stored in a memory medium M that is detachably mounted to the detachable-medium memory device 515, and is loaded to the secondary memory device 514 or to the RAM 512 from the memory medium M via the detachable-medium memory device 515. Alternatively, the computer program may be stored in a memory medium (not shown) located at a remote site, and is loaded to the secondary memory device 514 or to the RAM 512 from the remote memory medium via the communication device 523 and the interface 516.

When the user enters program execution instructions via the keyboard 521 and/or the mouse 522, the CPU 511 loads the computer program to the RAM 512 from the memory medium M, the remote memory medium, or the secondary memory device 514. Using an available memory space of the RAM 512 as a work area, the CPU 511 executes the program loaded to the RAM 512, and carries out processing steps while interacting with the user as necessary. The ROM 513 stores control programs for controlling basic operations of the computer 510.

In FIG. 14, the CPU 511 is shown as an example of a processing unit. In addition, one or more co-processors or the like may be provided for the purpose of executing complex mathematical computations. Further, DSP (digital signal processor) or the like may be employed to execute the computer program.

Further, the present invention is not limited to these embodiments, but various variations and modifications may be made without departing from the scope of the present invention.

The present application is based on Japanese priority application No. 2000-067788 filed on Mar. 10, 2000, with the Japanese Patent Office, the entire contents of which are hereby incorporated by reference.

What is claimed is:

1. A method of determining wire layouts of a circuit in a semiconductor device that includes a plurality of modules each corresponding to a circuit block, comprising the steps of:

provides module terminals of respective modules to be connected together in a single layer;

determining layouts of wires connected to the module terminals inside the respective modules by laying out the wires in one or more layers no higher than the single layer, said one or more layers including said single layer; and determining layouts of inter-module wires connecting between the module terminals by laying out the inter-module wires in the one or more layers no higher than the single layer, wherein the plurality of modules includes one of a first module having a physical layout which is not yet determined and/or a second module that has a determined physical layout.

2. A method of determining wire layouts of a circuit in a semiconductor device that includes a plurality of modules, each corresponding to a circuit block, comprising the steps of:

providing module terminals of respective modules in a single layer for a first one of the modules and a second one of the modules that are to be connected together;

identifying a highest layer used in the first one of the modules if the first one of the modules has internal wire layouts thereof already determined in advance;

determining layouts of wires connected to the module terminals inside the second one of the modules such that the wires reach a layer that is the same as said highest layer if the second one of the modules has no internal wire layouts thereof determined; and determining layouts of inter-module wires connecting between the module terminals by laying out the inter-module wires in the one or more layers no higher than the single layer.

3. The method as claimed in claim 1, further comprising a step of checking whether an antenna error occurs within each of the plurality of modules to ensure that wires inside each of the plurality of modules are laid out without antenna error.

4. A method of determining wire layouts of a circuit in a semiconductor device that includes a plurality of modules each corresponding to a circuit block, comprising the steps of:

determining a highest wire layer to be used in the semiconductor device; and providing a module terminal of a first module in said highest wire layer if the module terminal is connected to an input of a logic device inside the module, and is to be connected to a second module, wherein the first module and the second module have no internal wire layouts thereof determined.

5. The method as claimed in claim 4, further comprising a step of checking whether an antenna error occurs within each of the plurality of modules.

6. The method as claimed in claim 4, further comprising a step of determining layouts of wires between modules without any layout restrictions as to which wire layers are to be used.

7. The method as claimed in claim 4, further comprising a step of determining layouts of inter-module wires connecting between the module terminals by laying out the inter-module wires in one or more layers no high than the highest wire layer.

8. A computer-aided-design system for determining wire layouts of a circuit in a semiconductor device that includes a plurality of modules each corresponding to a circuit block, comprising:

a unit providing module terminals of respective modules to be connected together in a single layer;

a unit determining layouts of wires connected to the module terminals inside the respective modules by laying out the wires in one or more layers no higher than the single layer, said one or more layers including at least said single layer; and a unit determining layouts of inter-module wires connecting between the module terminals by laying out the inter-module wires in the one or more layers no higher than the single layer, wherein the plurality of modules includes a first module having a physical layout which is not yet determined and/or a second module having a determined physical layout.

9. A computer-aided-design system for determining wire layouts of a circuit in a semiconductor device that includes a plurality of modules each corresponding to a circuit block, comprising:

a unit providing module terminals of respective, first and second modules that are to be connected together in a single layer;

a unit identifying a highest layer used in the first one of the modules if the first one of the modules has internal wire layouts thereof already determined in advance; and a unit determining the layouts of wires connected to the module terminals inside the second one of the modules that are to be connected to module terminals of the first one of the modules such that the wires reach a layer that is the same as said highest layer if the second one of the modules has no internal wire layouts thereof determined; and a unit determining layouts of inter-module wires connecting between the module terminals by laying out the inter-module wires in the one or more layers no higher than the single layer.

10. The system as claimed in claim 8, further comprising a unit for checking whether an antenna error occurs within each of the plurality of modules to ensure that wires inside each of the plurality of modules are laid out without antenna error.

11. A computer-aided-design system for determining wire layouts of a circuit in a semiconductor device that includes a plurality of modules each corresponding to a circuit block, comprising:

a unit for determining a highest wire layer to be used in the semiconductor device; and a unit for providing a module terminal of a first module in said highest wire layer if the module terminal is connected to an input of a logic device inside the module, and is to be connected to a second module, wherein the first module and the second module have no internal wire layouts thereof determined.

12. The system as claimed in claim 11, further comprising a unit for checking whether an antenna error occurs within each of the plurality of modules.

13. The system as claimed in claim 11, further comprising a unit for determining layouts of wires between modules without any layout restrictions as to which wire layers are to be used.

14. A computer-readable medium having a program embodied therein for causing a computer to determine wire layouts of a circuit in a semiconductor device that includes a plurality of modules, each corresponding to a circuit block, said program comprising the computer-code steps of:

providing module terminals of modules to be connected together in a single layer;

determining layouts of wires connected to the module terminals inside the respective modules by laying out the wires in one or more layers no higher than the single layer, said one or more layers including said single layer; and determining layouts of inter-module wires connecting between the module terminals by laying out the inter-module wires in the one or more layers no higher than the single layer, wherein the plurality of modules includes a first module having a physical layout which is not yet determined and/or a second module having a determined physical layout.

15. A computer-readable medium having a program embodied therein for causing a computer to determine wire layouts of a circuit in a semiconductor device that includes a plurality of modules each corresponding to a circuit block, said program comprising the computer-code steps of:

determining a highest wire layer to be used in the semiconductor device; and providing a module terminal of a first module in said highest wire layer if the module terminal is connected to an input of a logic device inside the module, and is to be connected to a second module, wherein the first module and the second module have no internal wire layouts thereof determined.

16. A method of determining wire layouts of a circuit in a semiconductor device that includes a plurality of modules each corresponding to a circuit block, comprising the steps of:

providing a first module terminal of a first module to be connected to a second terminal of a second module in a single layer, wherein a physical layout of the first module is not yet determined;

determining layouts of wires connected to the first module terminal inside the first module by laying out the wires in at least the single layer; and determining layouts of inter-module wires connected between the first module terminal and the second terminal by laying out the inter-module wires in one or more layers no higher than the single layer, wherein the plurality of modules includes a module having a physical layout which is not yet determined and/or a module having a determined physical layout.

17. A computer-aided-design system determining wiring layouts of a circuit in a semiconductor device including a plurality of modules, each corresponding to a circuit block employing a computer program controlling a computer to perform the steps of:

providing a first module terminal of a first module to be connected to a second terminal of a second module in a single layer, wherein a physical layout of the first module is not yet determined;

determining layouts of wires connected to the first module terminal inside the first module by laying out at least one wire in at least the single layer; and determining layouts of inter-module wires connected between the first module terminal and the second terminal by laying out the inter-module wires in one or more layers no higher than the single layer, wherein the plurality of modules includes a module having a physical layout which is not yet determined and/or a module having a determined physical layout.

18. A computer-readable medium, storing a program for controlling a computer to determine wire layouts of a circuit in a semiconductor device that includes a plurality of modules, comprising the computer-code steps of:

providing a first module terminal of a first module to be connected to a second terminal of a second module in a single layer, wherein a physical layout of the first module is not yet determined;

determining layouts of wires connected to the first module terminal inside the first module by laying out at least one wire in at least the single layer; and determining layouts of inter-module wires connected between the first module terminal and the second terminal by laying out the inter-module wires in one or more layers no higher than the single layer, wherein the plurality of modules includes a module having a physical layout which is not yet determined and/or a module having a determined physical layout.

* * * * *